United States Patent
Tsujimoto

(10) Patent No.: US 7,665,053 B2
(45) Date of Patent: Feb. 16, 2010

(54) SEMICONDUCTOR DEVICE LAYOUT METHOD AND LAYOUT PROGRAM

(75) Inventor: Hiroyuki Tsujimoto, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 259 days.

(21) Appl. No.: 11/892,533

(22) Filed: Aug. 23, 2007

(65) Prior Publication Data
US 2008/0052657 A1 Feb. 28, 2008

(30) Foreign Application Priority Data
Aug. 28, 2006 (JP) .............................. 2006-230462

(51) Int. Cl.
*G06F 17/50* (2006.01)
(52) U.S. Cl. ................. 716/6; 716/9; 716/10; 716/13; 716/14
(58) Field of Classification Search ................... 716/6, 716/9, 10, 13, 14
See application file for complete search history.

(56) References Cited

U.S. PATENT DOCUMENTS

| | | | |
|---|---|---|---|
| 7,278,120 B2 * | 10/2007 | Rahmat et al. | 716/2 |
| 2005/0251775 A1 * | 11/2005 | Wood | 716/10 |
| 2006/0031795 A1 * | 2/2006 | Rahmat et al. | 716/5 |
| 2008/0052654 A1 * | 2/2008 | Rahmat et al. | 716/6 |
| 2008/0203494 A1 * | 8/2008 | Secareanu et al. | 257/378 |

FOREIGN PATENT DOCUMENTS

| | | |
|---|---|---|
| JP | 2002-288253 | 10/2002 |
| JP | 2004-055954 | 2/2004 |
| JP | 2006-040962 | 2/2006 |

OTHER PUBLICATIONS

Bernstein et al., automated translation of Japanese Patent Document No. 2002-288253 A, machine translated on Jul. 5, 2009, 24 pages.*
Kazuki, automated translation of Japanese Patent Document No. 2006-040962 A, machine translated on Jul. 5, 2009, 9 pages.*

* cited by examiner

*Primary Examiner*—Phallaka Kik
(74) *Attorney, Agent, or Firm*—Staas & Halsey LLP

(57) ABSTRACT

It is an aspect of the embodiments discussed herein to provide a semiconductor device layout method and a semiconductor device layout program that enable the minimum necessary decoupling capacitances to be placed efficiently according to a circuit configuration, placement positions, operation timings, and clock tree of functional circuits.

14 Claims, 5 Drawing Sheets

FLOWCHART OF SEMICONDUCTOR DEVICE LAYOUT METHOD ACCORDING TO FIRST EMBODIMENT

FLOWCHART OF SEMICONDUCTOR DEVICE LAYOUT METHOD ACCORDING TO FIRST EMBODIMENT

FIG.2 SCHEMATIC VIEW OF PHYSICAL LAYOUT BY SEMICONDUCTOR DEVICE LAYOUT METHOD ACCORDING TO FIRST EMBODIMENT

FLOWCHART OF SEMICONDUCTOR DEVICE LAYOUT METHOD ACCORDING TO SECOND EMBODIMENT

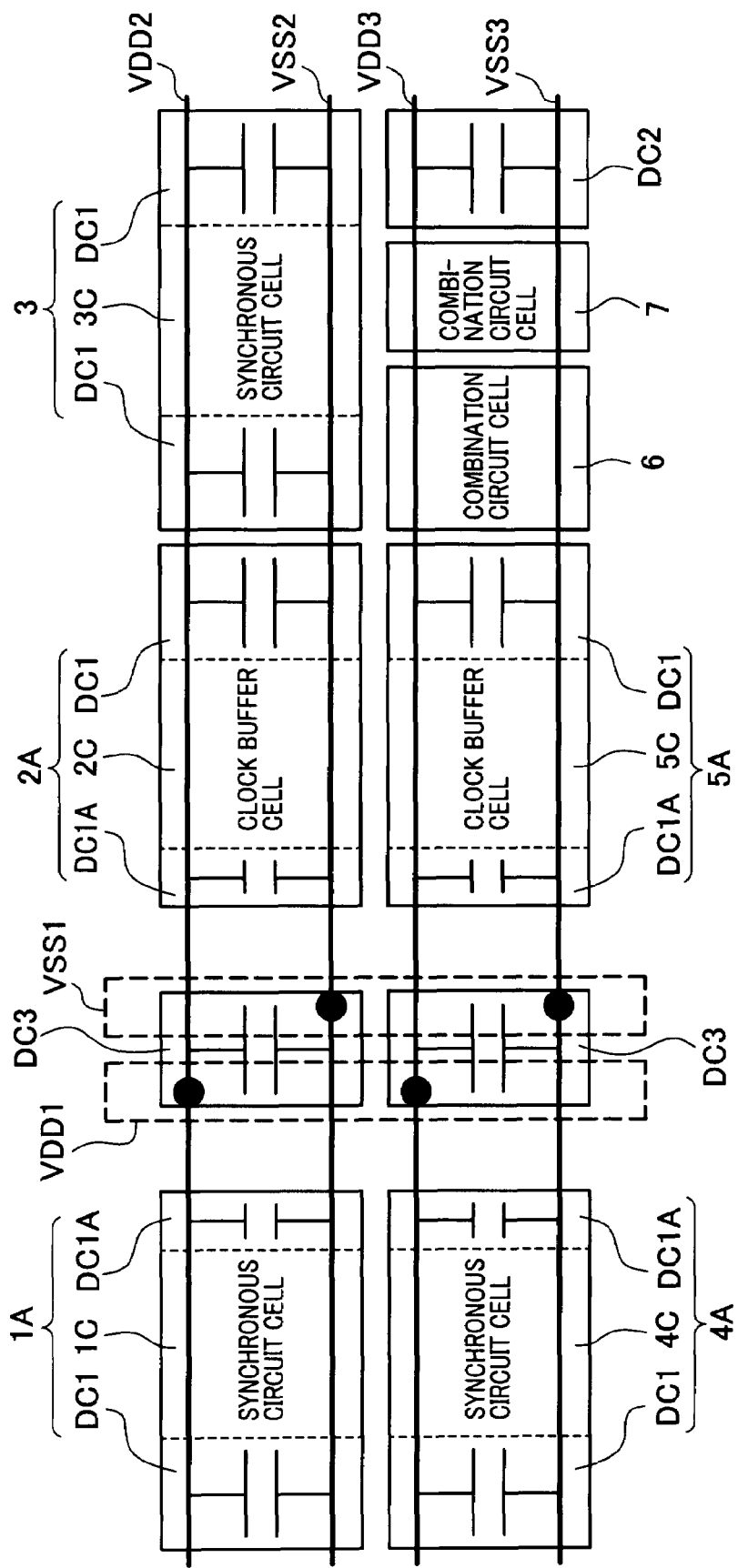
FIG.5 SCHEMATIC VIEW OF PHYSICAL LAYOUT BY SEMICONDUCTOR DEVICE LAYOUT METHOD ACCORDING TO FIRST EMBODIMENT

SEMICONDUCTOR DEVICE LAYOUT METHOD AND LAYOUT PROGRAM

CROSS-REFERENCE TO RELATED APPLICATIONS

This application is based upon and claims the benefit of priority from the prior Japanese Patent Application No. 2006-230462 filed on Aug. 28, 2006, the entire contents of which are incorporated herein by reference.

BACKGROUND

1. Field

The embodiment relates to a semiconductor device layout method and layout program concerning decoupling capacitances that are placed in a semiconductor device to prevent malfunction due to power supply noise.

2. Description of the Related Art

With the making of semiconductor devices finer and/or more highly integrated in recent years, operation power supply voltages are being made lower and/or operation frequencies are being made higher. However, when power supply noise is increased due to increase of the operation frequency on one hand while the operation power supply voltage is decreased on the other hand, malfunction and other adverse effects on circuit operations that accompany power supply noise become problematic.

As a countermeasure against such a problem, placement of decoupling capacitances for suppressing the power supply noise is considered. With a decoupling capacitance placement method disclosed in Japanese Unexamined Patent Publication No. 2006-40962, before placing logic cells, decoupling capacitances are placed in a target area in an averaged manner and then the logic cells are placed at areas free of the decoupling capacitances.

Upon partitioning the target area into a plurality of unit areas, an average consumption power is computed for each unit area from a total consumption power of the logic cells to be placed in the target area. The average consumption power is compared with the consumption power of the logic cells placed in each unit area, and whether or not the decoupling capacitance is inadequate is computed for each unit area.

If it is judged that the decoupling capacitance in a unit area is inadequate, a portion of the logic cells in the unit area is moved to another unit area or a logic change such that the consumption power of the logic cells in the unit area is reduced is made to make the decoupling capacitance adequate in the unit area.

Other related arts are disclosed in Japanese Unexamined Patent Publication No. 2004-55954 and Japanese Unexamined Patent Publication No. 2002-288253.

SUMMARY

It is an aspect of the embodiments discussed herein to provide a semiconductor device layout method and a semiconductor device layout program that enable the minimum necessary decoupling capacitances to be placed efficiently according to a circuit configuration, placement positions, operation timings, and clock trees of functional circuits.

BRIEF DESCRIPTION OF THE DRAWINGS

FIG. 5 is a schematic view of a physical layout by the semiconductor device layout method according to the second embodiment.

DETAILED DESCRIPTION OF THE PREFERRED EMBODIMENTS

Figure 1:
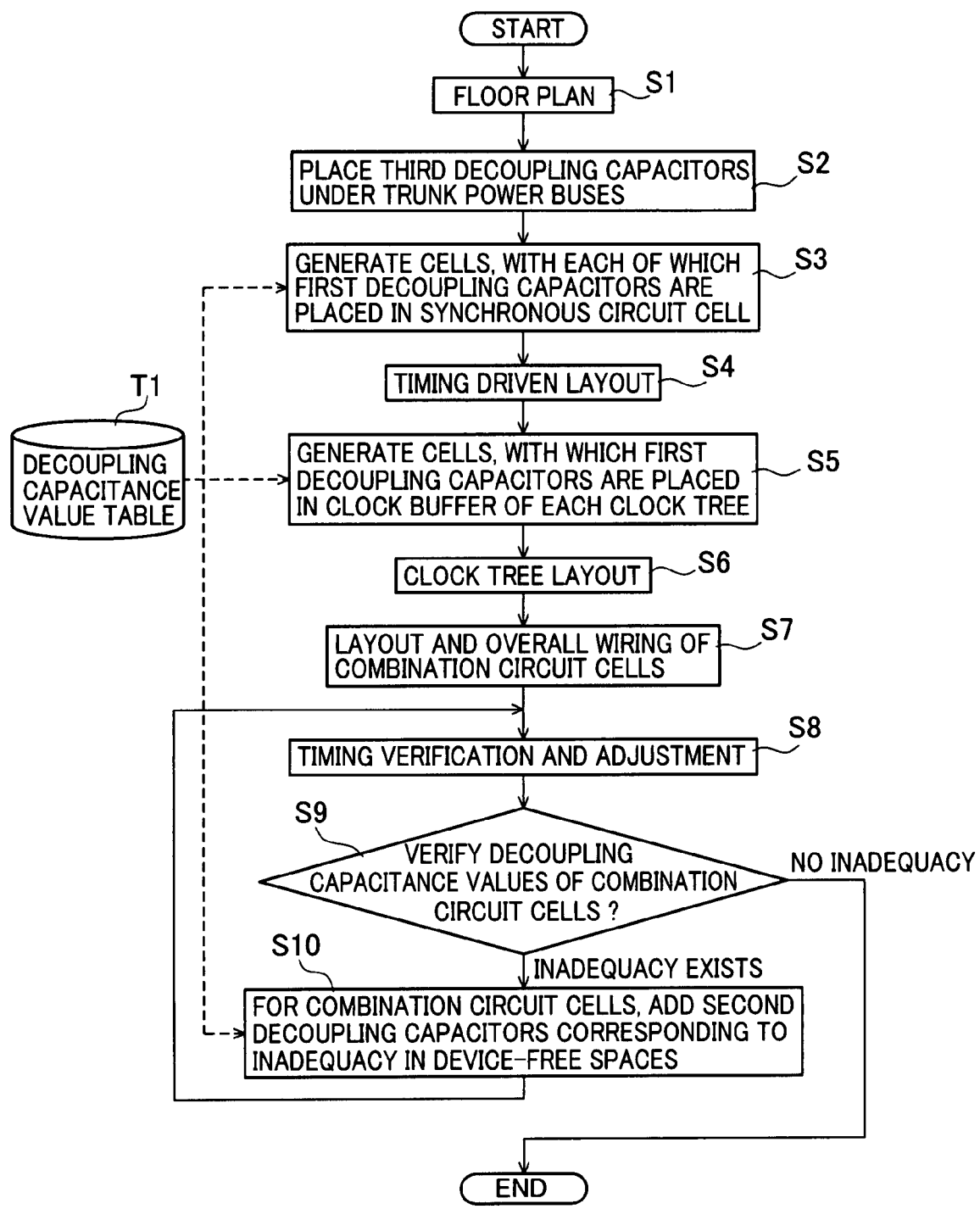
FIG. 1 is a flowchart of a semiconductor device layout method according to a first embodiment.

Although in a semiconductor device that is made fine, highly integrated, low in power supply voltage, and high in operation frequency, the magnitudes and generation timings of power supply noise that accompanies circuit operations vary variously according to the circuit configuration of logic cells and other functional circuits that perform logic operations, according to the placement positions of the functional circuits on a chip, and furthermore in accordance with clock trees for making the functional circuits placed on the chip operate reliably, and with the decoupling capacitance placement method according to Japanese Unexamined Patent Publication No. 2006-40962, these factors cannot be incorporated effectively in the placement of the decoupling capacitances.

For example, functional circuits installed in a semiconductor device can largely be classified into two types of circuits. These are: synchronous circuits that operate in synchronization with a clock signal; and asynchronous circuits that are not synchronized to a clock signal, as represented by combination circuits, etc. A semiconductor device of large scale may be configured from functional circuits that are mainly synchronous circuits. In this case, a plurality of functional circuits operate substantially simultaneously in synchronization with a clock signal, and the peak value of power supply noise may become large in accordance with the operation timings of the synchronous circuits. In cases where synchronous circuits and asynchronous circuits are present mixedly as the functional circuits installed in a semiconductor device, the magnitude of the power supply noise differs according to the circuit configuration of the functional circuits, and optimal placement of decoupling capacitances is important.

Also, preferably, synchronous circuits are matched in operation times by operating in synchronization with the clock signal. Thus, a so-called timing driven layout method, with which synchronous circuits that operate at the same timing are placed proximally with priority, is employed in some cases. In this case, areas, in which a large power supply peak is generated at a specific timing, become present in a localized manner in the semiconductor device and power supply noise is generated thereby. It is thus important to place decoupling capacitances in accordance with the layout of functional circuits formed by the timing driven layout method, etc.

Furthermore, as the circuit scale becomes large, it becomes important to suppress propagation delay (so-called clock skew) of the clock signal on the chip in order to match operation timings among synchronous circuits. This is accommodated by inserting clock buffer circuits in the clock signal paths. The insertion positions and drive capabilities of clock buffer circuits differ according to the placement positions of the synchronous circuits on the chip and, in general, these are normally determined in accordance with the layout of the functional circuits. It is important to place decoupling capacitances in accordance with the insertion positions and the inserted number of the clock buffer circuits and the drive capabilities of the clock buffer circuits.

Specific embodiments of the semiconductor device layout method and layout program according to the present embodiment shall now be described in detail based on and with reference to FIGS. 1 to 5.

First Embodiment

Figure 2:
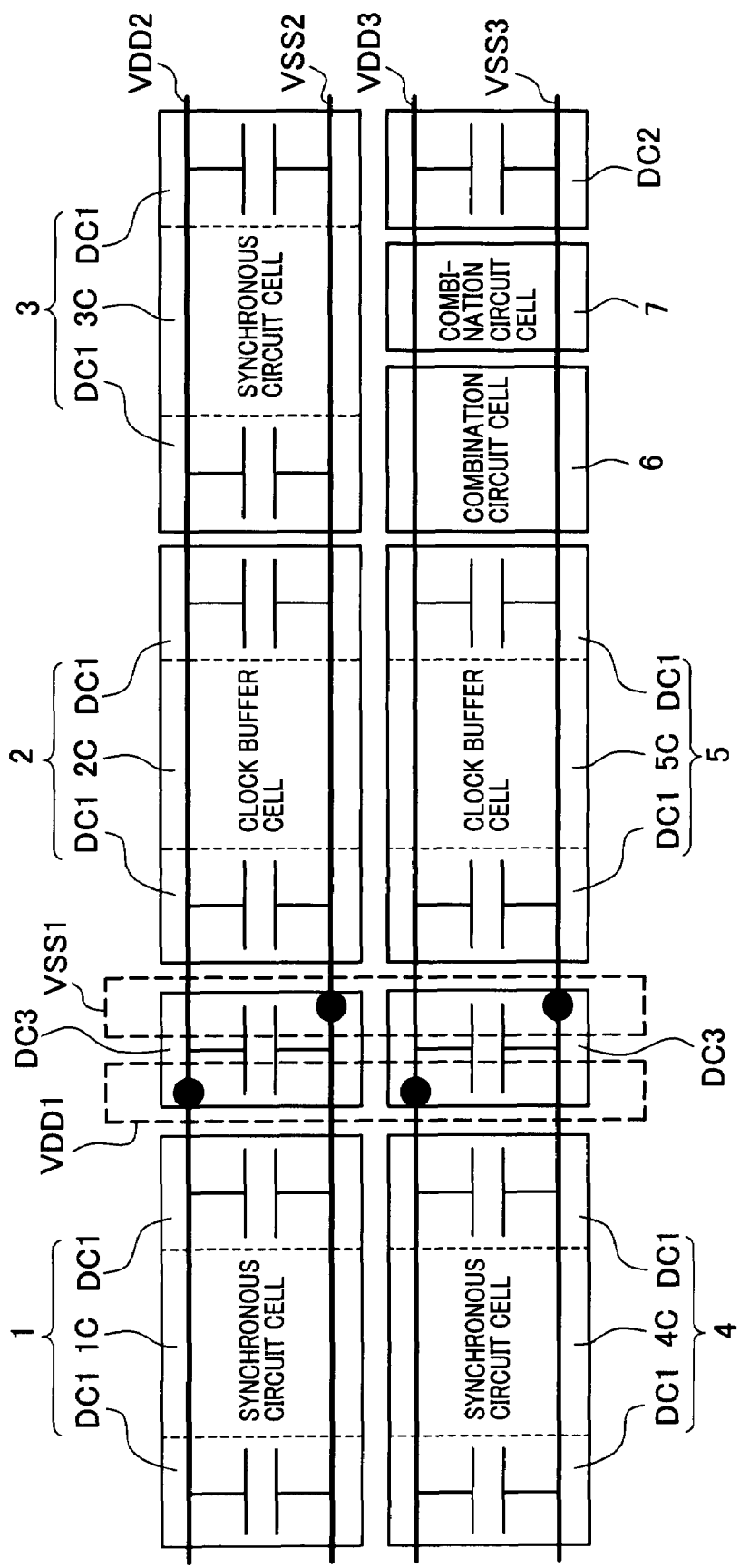
FIG. 2 is a schematic view of a physical layout by the semiconductor device layout method according to the first embodiment.

FIG. 1 is a flowchart of a semiconductor device layout method according to a first embodiment. FIG. 2 is a schematic view of a physical layout by the semiconductor device layout method according to the first embodiment. The following description shall mainly be centered on the flowchart of FIG. 1, with reference given to FIG. 2 as necessary.

In step S1, floor planning is executed to generate an I/O frame of a semiconductor device and determine a general layout of functional modules based on circuit connection information.

In step S2, third decoupling capacitors DC3 are placed under trunk power buses. In FIG. 2, two third decoupling capacitors DC3 that are placed under trunk power buses VDD1 and VSS1 are shown.

In step S3, cells, each having first decoupling capacitors placed in a synchronous circuit cell, aregenerated. In this process, the output load capacitance of each synchronous circuit cell is computed based on the circuit information, and a decoupling capacitance table T1 is referenced to determine the required decoupling capacitance value. In FIG. 2, a synchronous cell 1, with which first decoupling capacitors DC1 are placed at respective ends of a synchronous circuit cell 1C, is generated.

In step S4, a timing driven layout is performed by which the synchronous circuit cells generated in step S3 that operate at the same timing are placed proximally with priority so that the operation times of the synchronous circuits are matched.

In step S5, first clock buffer cells, with which first decoupling capacitors are placed in a clock buffer of each clock tree, are generated. In this process, the output load capacitance of each clock buffer is computed based on circuit information in accordance with the clock tree, and the decoupling capacitance table T1 is referenced to determine the required decoupling capacitance value.

In step S6, a clock tree layout, by which the clock buffers are placed, is performed based on the clock trees. The cells used in this clock tree layout are the first clock buffer cells generated in step S5.

In step S7, layout and overall wiring of combination circuit cells are performed based on the circuit connection information.

In step S8, after layout and wiring have been performed, whether or not the circuit has been designed to operate within the desired time is verified. If the circuit is not designed to operate within the desired time, functional cells are changed or added as necessary to perform timing adjustment.

Although up to step S8, decoupling capacitors are not added to combination circuit cells, the combination circuit cells differ in operation timing from synchronous circuit cells and, in some cases, can make shared use of the decoupling capacitors of the synchronous circuit cells.

Figure 3:
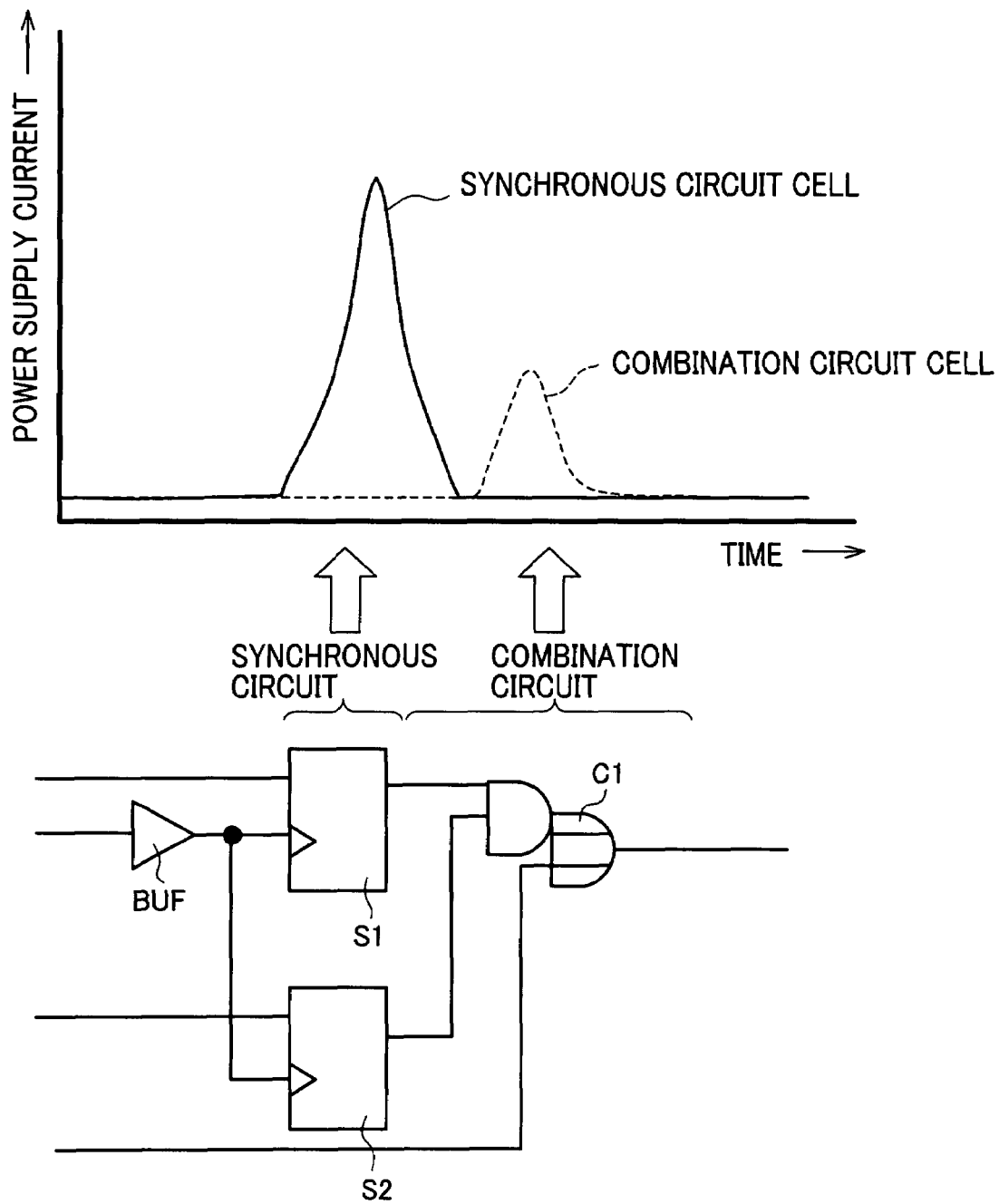
FIG. 3 is a diagram of power supply current relationships of synchronous circuits and a combination circuit.

FIG. 3 is a diagram of power supply current relationships of synchronous circuits and a combination circuit. Here, because output changes, resulting from operation of the synchronous circuits S1 and S2, propagate into inputs of the combination circuit C1 and make the combination circuit C1 operate, the synchronous circuits and the combination circuit are shifted in the timing at which the power supply current peaks. Due to this shift of the timing at which the power supply current peaks, a case where a decoupling capacitor of a synchronous circuit cell can be shared as the decoupling capacitor of a combination circuit arises.

In step S9, verification of the decoupling capacitance values of the combination circuit cells is performed. If it is judged that the shared use of a first decoupling capacitor does not give rise to an inadequacy in the decoupling capacitance value of a combination circuit cell, a decoupling capacitance is not added. In FIG. 2, it is judged that for a combination circuit cell 6, the capacitance value of a first decoupling capacitor DC1 in a clock buffer cell 5 is adequate. The combination circuit cell 6 is thus made to share the first decoupling capacitor DC1 in the clock buffer cell 5.

On the other hand, if it is judged that there is an inadequacy in the decoupling capacitance value of a combination circuit cell, step S10 is entered.

In step S10, a second decoupling capacitor for the combination circuit cell is added in a device-free space. In this process, the output load capacitance of the combination circuit is computed based on the circuit information, and the decoupling capacitance table T1 is referenced to determine the required decoupling capacitance value. Thereafter, step S8 is returned to in order to re-verify whether or not the circuit is designed to perform operation in the desired time. In FIG. 2, because inadequacy of the decoupling capacitance value was judged for a combination circuit cell 7, a second decoupling capacitor DC2 is placed adjacently.

By execution of the above-described steps S1 to S10, the layout of the semiconductor device is completed. Although in the present embodiment, the differences in the operation timings of the synchronous circuit cells and the combination circuit cells are noted to make shared use of decoupling capacitors, if the layout space inside the semiconductor device allows, a method, with which, before logic cells are placed in the process of laying out combination circuit cells in step S7, decoupling capacitances are placed in an averaged manner in the target area and the logic cells are then placed combinedly according to operation currents in areas free of the decoupling capacitances, may be employed instead.

In this case, the judgment that there is no inadequacy is made in step S9 and the layout process can be ended without entering step S10.

The semiconductor device layout method and layout program according to the first embodiment includes the steps of: adding, to synchronous circuits and clock buffers that perform output operations at a clock timing, first decoupling capacitors that match the consumption currents (step S3 and step S5); placing combination circuits that perform output operations at timings that differs from the clock timing (step S7); verifying whether a first decoupling capacitor is adequate for the decoupling capacitance value required by a corresponding combination circuit (step S9); and, if the decoupling capacitance value is inadequate for the combination circuit, adding a second decoupling capacitor to the combination circuit (step S10).

First decoupling capacitors that match the synchronous circuits and the clock buffers can thereby be added reliably, and with the combination circuits, appropriate second decoupling capacitors can be added while making shared use of the first decoupling capacitors of the synchronous circuits and the clock buffers.

The semiconductor device layout method and layout program according to the first embodiment also includes the steps, in which, in adding first decoupling capacitors to a synchronous circuit or a clock buffer, the first decoupling capacitors are joined to the synchronous circuit or the clock buffer to form a single cell (step S3 and step S5).

A logic cell before addition of first decoupling capacitors can thereby be handled as the same logic cell after addition of the first decoupling capacitors.

Also, with the semiconductor device layout method and layout program according to the first embodiment, the capacitance values of the first and second decoupling capacitors, added to the synchronous circuits, the clock buffers, and the combination circuits, are determined based on the output load information of the respective circuits.

Because the capacitance values of the first and second decoupling capacitors are determined based on the output load information, first and second decoupling capacitors that are in accordance with actual operations can be added.

Also, with the semiconductor device layout method and layout program according to the first embodiment, the capacitance values of the first and second decoupling capacitors are determined in reference to the decoupling capacitance table T1, with which capacitance values of the first and second decoupling capacitors are associated with output load information.

This makes it unnecessary to perform calculations each time a first or second decoupling capacitor is added and the processing load can thereby be lightened.

Second Embodiment

Figure 4:
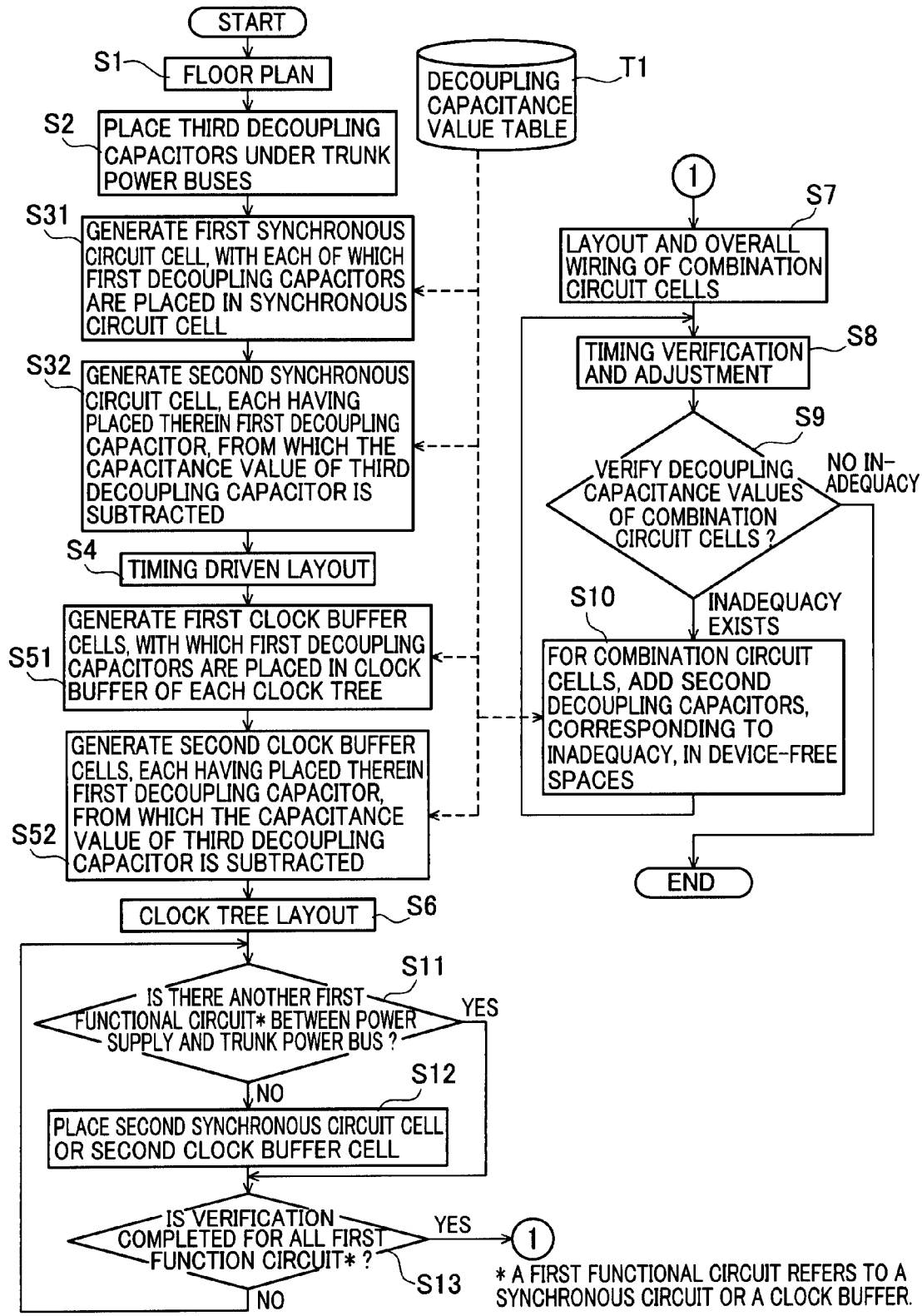
FIG. 4 is a flowchart of a semiconductor device layout method according to a second embodiment.

A second embodiment shall now be described. FIG. 4 is a flowchart of a semiconductor device layout method according to a second embodiment. FIG. 5 is a schematic view of a physical layout by the semiconductor device layout method according to the second embodiment. In the second embodiment, step S3 in the first embodiment is divided into steps S31 and S32, step S5 in the first embodiment is divided into step S51 and S52, and steps S11 to S14 are added. Thus, in the following description, process portions that differ from those of the first embodiment shall be described in detail and description of process portions that are the same shall be simplified or omitted.

In step S2, third decoupling capacitors DC3 are placed under trunk power buses. In FIG. 5, two third decoupling capacitors DC3 that are placed under trunk power buses VDD1 and VSS1 are shown.

In step S31, first synchronous circuit cells, with each of which first decoupling capacitors are placed in a synchronous circuit cell, are generated. In this process, the output load capacitance of each synchronous circuit cell is computed based on the circuit information, and the decoupling capacitance table T1 is referenced to determine the required decoupling capacitance value. This process in itself is the same as that of step S3 of the first embodiment.

In step S32, second synchronous circuit cells, each having placed therein a first decoupling capacitor, from which the capacitance value of a third decoupling capacitor placed under a trunk power bus is subtracted, are generated. In this process, the output load capacitance of each synchronous circuit cell is computed based on the circuit information, and the decoupling capacitance table T1 is referenced to determine the required decoupling capacitance value. In FIG. 5, a synchronous circuit cell 1A, with which a first decoupling capacitor DC1 is placed at a left end and a first decoupling capacitor DC1A is placed at a right end of a synchronous circuit cell 1C, corresponds to being a second synchronous circuit cell.

In step S4, a timing driven layout is performed by which the synchronous circuit cells that operate at the same timing are placed proximally with priority so that the operation times of the synchronous circuit cells are matched. The cells used in this timing driven layout are the first synchronous circuit cells generated in step S31.

In step S51, first clock buffer cells, with which first decoupling capacitors are placed in a clock buffer of each clock tree, are generated. In this process, the output load capacitance of each clock buffer is computed based on circuit information in accordance with the clock tree, and the decoupling capacitance table T1 is referenced to determine the required decoupling capacitance value. This process in itself is the same as that of step S5 of the first embodiment.

In step S52, second clock buffer cells, each having placed therein a first decoupling capacitor, from which the capacitance value of a third decoupling capacitor placed under a trunk power bus is subtracted, is generated. In this process, the output load capacitance of each clock buffer is computed based on circuit information in accordance with the corresponding clock tree, and the decoupling capacitance table T1 is referenced to determine the required decoupling capacitance value. In FIG. 5, a clock buffer cell 2A, with which a first decoupling capacitor DC1A is placed at a left end and a first decoupling capacitor DC1 is placed at a right end of a clock buffer cell 2C, corresponds to being a second clock buffer cell.

In step S6, a clock tree layout is performed by which the clock buffers are placed based on the clock trees. The cells used in this clock tree layout are the first clock buffer cells generated in step S51.

In step S11, it is judged whether or not, between a first functional circuit and a trunk power bus, there is another first functional circuit (that is, a synchronous circuit or a clock buffer) having a power line in common. If it is judged that there is another first functional circuit, step S13 is entered, while if it is judged that there is no other circuit, step S12 is entered. In FIG. 5, a synchronous circuit cell 3, with which first decoupling capacitors DC1 are provided at respective ends of a synchronous circuit cell 3C, cannot make shared use of a third decoupling capacitor DC3 due to the presence of the clock buffer cell 2A and cannot be replaced by a second synchronous circuit cell.

In step S12, a first synchronous circuit cell is replaced by a second synchronous circuit cell, or a first clock buffer cell is replaced by a second clock buffer cell. In FIG. 5, the synchronous circuit cell 1A is a cell, with which a first synchronous circuit cell has been replaced by a second synchronous circuit cell, and the clock buffer cell 2A is a cell, with which a first clock buffer cell has been replaced by a second clock buffer cell.

In step S13, it is judged whether or not the verification of step S11 has been completed for all first functional circuits (that is, synchronous circuits or clock buffers). Whereas if the verification is not completed, a return to step S11 is performed, if the verification is completed, step S7 is entered. Because the processes from step S7 onward are the same as those of the first embodiment, description thereof shall be omitted. By the above processes, the layout of the semiconductor device is completed.

The semiconductor device layout method and layout program according to the second embodiment includes the step of: placing third decoupling capacitors under trunk power buses before performing a step of adding first decoupling capacitors (step S2); and the step of adding the first decoupling capacitors includes, in cases where there is no other first functional circuit sharing a power line in a path leading to a trunk power bus, a step of subtracting the capacitance value of a third decoupling capacitor from the capacitance value of a first decoupling capacitor (step S12).

Because the third decoupling capacitor under the trunk power bus can thereby be shared, the decoupling capacitor of each first functional circuit, for which no other first functional circuits sharing a power line is present in the path leading to the trunk power bus, can be reduced.

The embodiment is not restricted to the embodiments described above and various improvements and modifications are obviously possible without departing from the gist and scope of the embodiment.

For example, although in the first and second embodiments, the timing driven layout is performed before the clock tree layout, the embodiment can also be applied to cases where the clock tree layout is performed before the timing driven layout as well as cases where the timing driven layout and the clock tree layout are performed in parallel.

In step S10 of the first and second embodiments, a second decoupling capacitor corresponding to a capacitance inadequacy is added in a device-free space for a combination circuit cell. If there is a device-free space that enables use of a power line, along which an adjacent synchronous circuit cell or clock buffer is already placed, the combination circuit cell may be placed in this device-free space instead. The combination circuit cell can thereby be made to share the first decoupling capacitor of the synchronous circuit cell or the clock buffer and addition of an extra second decoupling capacitor can be suppressed.

Synchronous circuits and clock buffers are examples of the first functional circuit, and combination circuits are examples of the second functional circuit.

According to the embodiment, a semiconductor device layout method and a semiconductor device layout program that enable the minimum necessary decoupling capacitances to be placed efficiently according to the circuit configuration, placement positions, operation timings, and clock trees of functional circuits can be provided.

What is claimed is:

1. A semiconductor device layout method comprising:
    adding, to a first functional circuit that operates at a first timing, a first decoupling capacitor that matches a consumption current;
    placing a second functional circuit, operating at a second timing that differs from the timing of the first functional circuit, after the adding the first decoupling capacitor;
    verifying whether or not the first decoupling capacitor is adequate for a decoupling capacitance value required of the second functional circuit after the step of placing the second functional circuit; and
    if the decoupling capacitance value for the second functional circuit is inadequate, adding a second decoupling capacitor to the second functional circuit after the verifying the decoupling capacitance value of the second functional circuit by a computer.

2. The semiconductor device layout method according to claim 1, wherein
    the first functional circuit includes either or both of a synchronous circuit and a clock buffer that operate in synchronization with a clock.

3. The semiconductor device layout method according to claim 2, wherein
    the adding the first decoupling capacitor includes:
    adding, before placing the synchronous circuit, the first decoupling capacitor to the synchronous circuit based on circuit connection information;
    placing the synchronous circuit, to which the first decoupling capacitor has been added, and a clock tree; and
    adding the first decoupling capacitor to the clock buffer based on circuit connection information of the clock buffer generated according to the clock tree that has been placed.

4. The semiconductor device layout method according to claim 1, further comprising:
    placing a third decoupling capacitor below a trunk power bus before the step of adding the first decoupling capacitor; and
    wherein, if another functional circuit is not present in a path leading to the trunk power bus, the adding the first decoupling capacitor includes a step of subtracting the capacitance value of third decoupling capacitor from the capacitance value of the first decoupling capacitor.

5. The semiconductor device layout method according to claim 1, further comprising:
    joining the first decoupling capacitor to the first functional circuit to form a single cell in adding the first decoupling capacitor to the first functional circuit.

6. The semiconductor device layout method according to claim 1, wherein
    the capacitance values of the first and second decoupling capacitors added to the first and second functional circuits are determined based on output load information.

7. The semiconductor device layout method according to claim 6, further comprising:
    defining a decoupling capacitance value table, in which the capacitance values of the first and second decoupling capacitors are associated with the output load information.

8. A computer readable medium storing a semiconductor device layout program, which when executed on a computer causes the computer to perform a method comprising:
    adding, to a first functional circuit that operates at a first timing, a first decoupling capacitor that matches a consumption current;
    placing a second functional circuit that operates at a second timing that differs from the timing of the first functional circuit after the adding the first decoupling capacitor;
    verifying whether or not the first decoupling capacitor is adequate for a decoupling capacitance value required of the second functional circuit after the placing the second functional circuit; and
    if the decoupling capacitance value for the second functional circuit is inadequate, adding a second decoupling capacitor to the second functional circuit after the verifying the decoupling capacitance value of the second functional circuit.

9. The computer readable medium according to claim 8, wherein the first functional circuit includes either or both of a synchronous circuit and a clock buffer that operate in synchronization with a clock.

10. The computer readable medium according to claim 9, wherein the adding the first decoupling capacitor includes:
    adding, before placing the synchronous circuit, the first decoupling capacitor to the synchronous circuit based on circuit connection information;
    placing the synchronous circuit, to which the first decoupling capacitor has been added, and a clock tree; and
    adding the first decoupling capacitor to the clock buffer based on circuit connection information of the clock buffer generated according to the clock tree that has been placed.

11. The computer readable medium according to claim 8, said method further comprising:

placing a third decoupling capacitor below a trunk power bus before the step of adding the first decoupling capacitor; and wherein, if another functional circuit is not present in a path leading to the trunk power bus, the adding the first decoupling capacitor includes subtracting the capacitance value of third decoupling capacitor from the capacitance value of the first decoupling capacitor.

12. The computer readable medium according to claim 8, said method further comprising:

joining the first decoupling capacitor to the first functional circuit to form a single cell in adding the first decoupling capacitor to the first functional circuit.

13. The computer readable medium according to claim 8, wherein the capacitance values of the first and second decoupling capacitors added to the first and second functional circuits are determined based on output load information.

14. The computer readable medium according to claim 13, the method further comprising:

defining a decoupling capacitance value table, in which the capacitance values of the first and second decoupling capacitors are associated with the output load information.

* * * * *